(12) United States Patent
Lu et al.

(10) Patent No.: US 10,705,118 B2
(45) Date of Patent: Jul. 7, 2020

(54) POWER MODULE TESTING APPARATUS

(71) Applicant: Ford Global Technologies, LLC, Dearborn, MI (US)

(72) Inventors: Xi Lu, Northville, MI (US); Krishna Prasad Bhat, Belleville, MI (US); Chingchi Chen, Ann Arbor, MI (US); Zhuxian Xu, Novi, MI (US); Guangyin Lei, Dearborn Heights, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 379 days.

(21) Appl. No.: 15/467,920

(22) Filed: Mar. 23, 2017

(65) Prior Publication Data

US 2018/0275168 A1 Sep. 27, 2018

(51) Int. Cl.
*G01R 1/067* (2006.01)
*G01R 1/073* (2006.01)
*G01R 1/06* (2006.01)
*G01R 15/14* (2006.01)
*G01R 17/02* (2006.01)

(52) U.S. Cl.
CPC .......... *G01R 1/06766* (2013.01); *G01R 1/06* (2013.01); *G01R 1/07307* (2013.01); *G01R 15/146* (2013.01); *G01R 17/02* (2013.01)

(58) Field of Classification Search
CPC .. G01R 1/203; G01R 15/146; G01R 19/0007; G01R 1/06; G01R 1/06766; G01R 1/07307
USPC .................................................. 324/754.03
See application file for complete search history.

(56) References Cited

U.S. PATENT DOCUMENTS

| | | | |
|---|---|---|---|
| 7,649,363 B2 | 1/2010 | Lemson | |
| 9,077,172 B2 | 7/2015 | Faxvog et al. | |
| 9,395,396 B2 * | 7/2016 | Kageyama | G01R 1/203 |
| 10,114,041 B2 * | 10/2018 | Lu | G01R 1/07307 |
| 10,352,968 B2 * | 7/2019 | Chen | |

* cited by examiner

*Primary Examiner* — Reena Aurora
(74) *Attorney, Agent, or Firm* — David B. Kelley; Brooks Kushman P.C.

(57) ABSTRACT

A testing apparatus includes a holster including a jack defining a conductive periphery configured to connect with a reference lead of the voltage probe to form a common ground. The apparatus includes a shunt defining first and second regions of different potential having predetermined difference. The second region is configured to connect with a reference lead of the shunt probe. The apparatus includes a bridge configured to connect the shunt probe lead with the common ground.

20 Claims, 3 Drawing Sheets

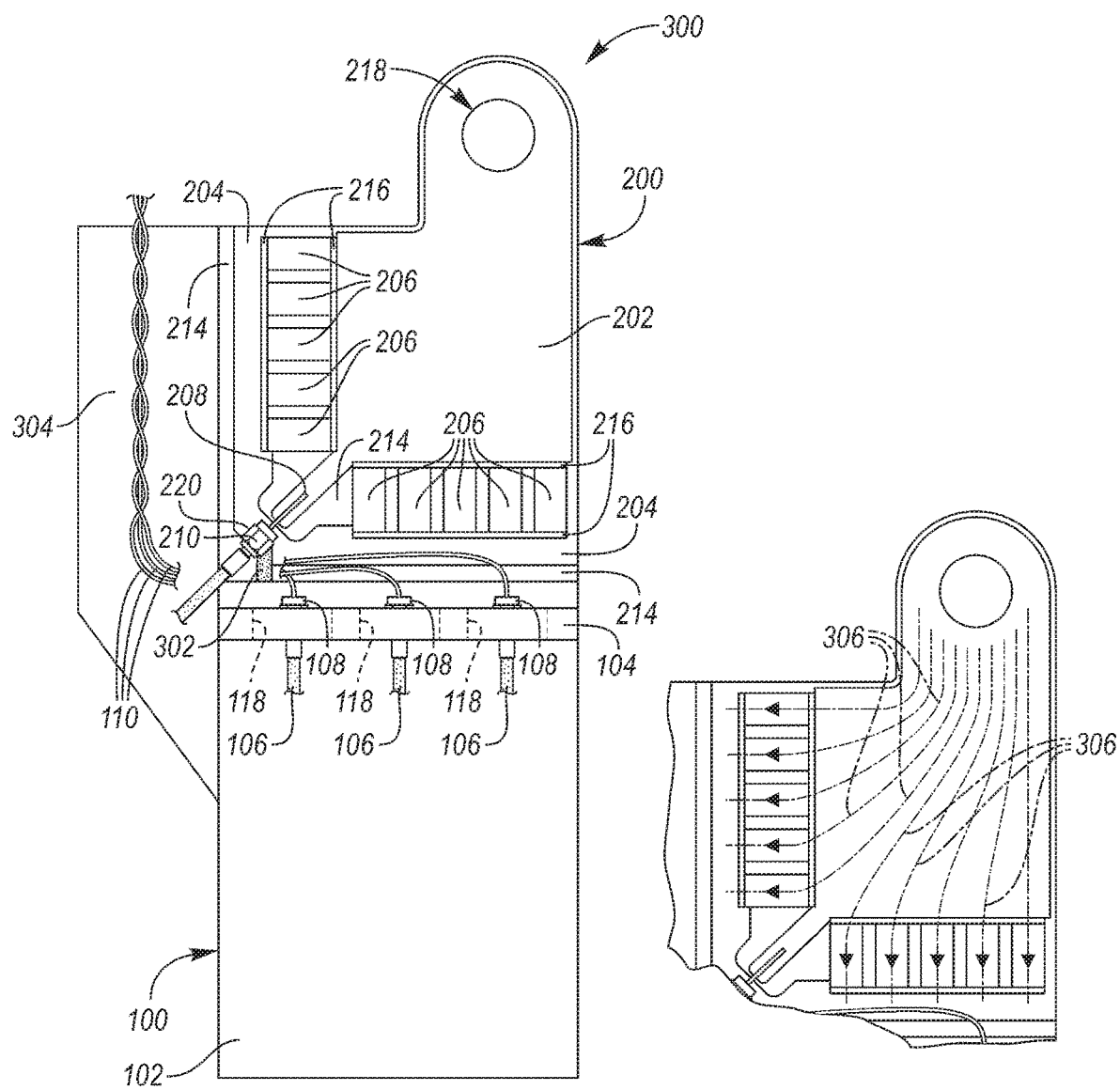
FIG. 2A
FIG. 2B
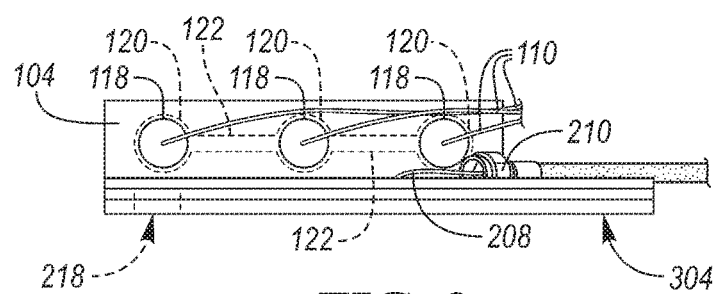
FIG. 3

POWER MODULE TESTING APPARATUS

TECHNICAL FIELD

This disclosure relates to a power module testing apparatus.

BACKGROUND

Electric machines may be driven by inverters having a plurality of solid-state switching devices. Measurement of a switching device's performance requires multiple voltage probes attached to predetermined locations on the switching device. Because other nonintrusive measurement methods (such as Rogwoski coil) have offset and delay problems, resistive shunts are placed in current flow paths to indirectly measure current flow. The probes are used to measure small voltages across the resistive shunts and other key locations on the switching devices. The measurement of these small voltages can be influenced by the effect of ground loops. Ground loops may increase measurement errors and impose ambiguity among the voltage measurements.

SUMMARY

A testing apparatus includes a holster including a jack defining a conductive periphery configured to connect with a reference lead of the voltage probe to form a ground loop. The apparatus includes a shunt defining first and second regions of different potential having predetermined difference. The second region is configured to connect with a reference lead of the shunt probe. The apparatus includes a bridge configured to connect the shunt probe lead with the ground loop.

A testing apparatus includes a shunt defining first and second regions of different potential having predetermined difference. The second region configured to connect with a shunt probe lead. The apparatus includes a holster having a jack with a conductive periphery sized to interconnect with a ground lead of a voltage probe forming a ground loop with the holster. The holster includes a shield disposed partially between at least one of the first or second region and an active lead of the voltage probe.

A testing apparatus includes a holster having a jack defining a conductive periphery configured to connect with a reference lead of a voltage probe to form a ground loop. The apparatus includes a shunt defining first and second regions of different potential having predetermined difference. The second region is configured to connect with a shunt probe lead. The apparatus includes a bridge traversing the shortest distance between the shunt probe lead and the ground loop configured to connect the shunt probe lead with the ground loop such that a common ground loop is formed between the second region and the holster.

BRIEF DESCRIPTION OF THE DRAWINGS

FIG. 2A is a top view of a testing apparatus;
FIG. 2B is a top view of a testing apparatus having current flow paths through a shunt;
FIG. 3 is a front view of a testing apparatus.

DETAILED DESCRIPTION

Figure 1:
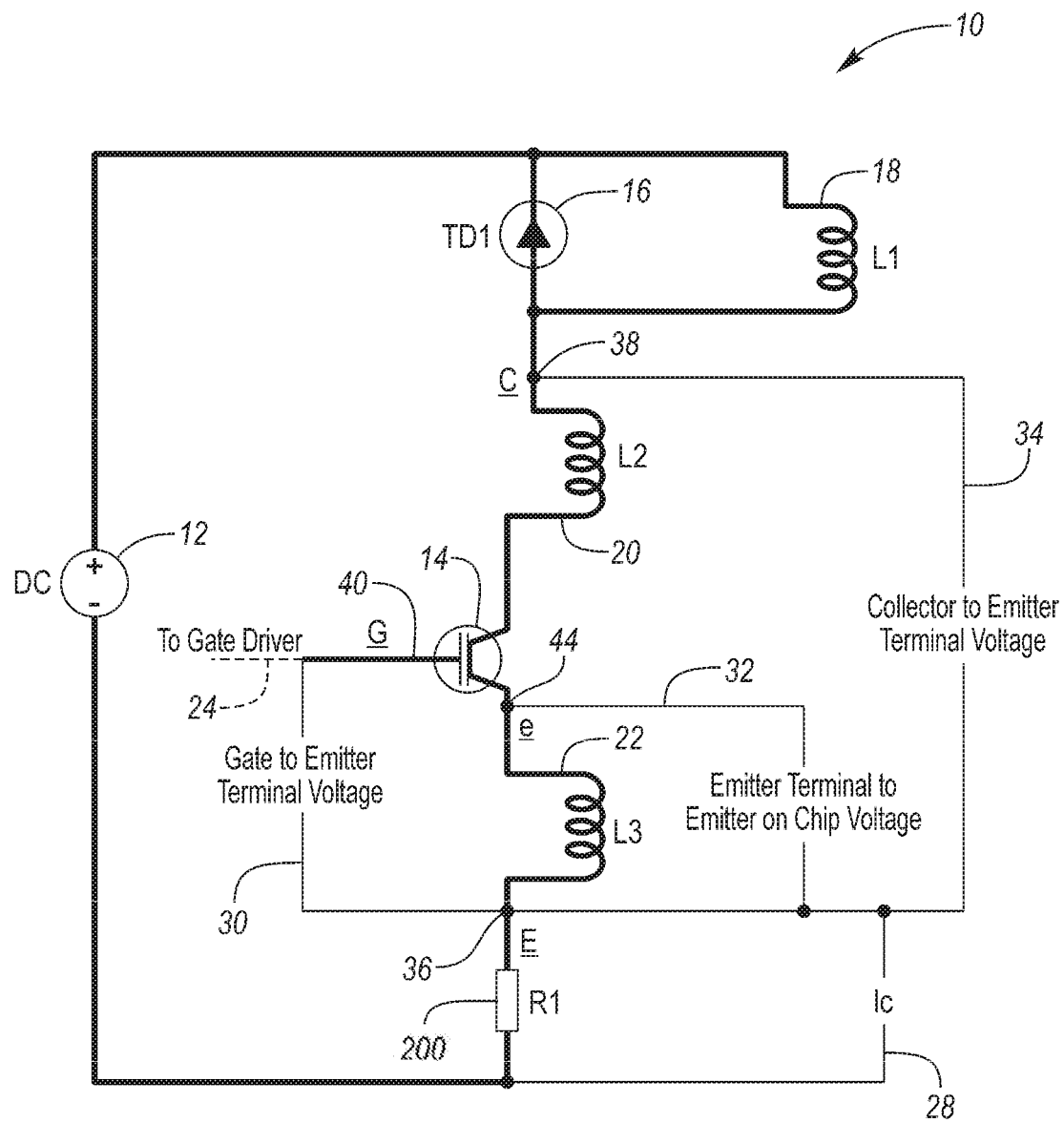
FIG. 1 is a schematic diagram of an IGBT test setup.

Embodiments of the present disclosure are described herein. It is to be understood, however, that the disclosed embodiments are merely examples and other embodiments may take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Various test points may be used to determine the performance of an IGBT or other semiconducting device. A testing apparatus may be configured to measure key parameters of the semiconductor. Three voltages and one current of an IGBT may be measured to determine IGBT performance. Because current cannot be measured directly, the apparatus may measure the current as a voltage drop across a resistor. Meaning, four voltages may be measured using voltage probes. The voltage probes may be single-ended. Single-ended voltage probes may have a pair of coaxial leads, one of the leads serves as a reference or ground, and the other of the leads serves as the point to be tested. The reference lead may surround the test lead, and both leads may be housed in a common cable. The reference leads may be connected to a holster. Separation of the reference leads may cause ground loops between the measurements. For the relatively high frequency and low voltages measured on the IGBT, the ground loops may cause significant noise and error during measurement. Ground loops form when two ground portions of a circuit have different potentials. Potential differences between ground connections may be formed by induction, capacitive coupling, or inherent conductor resistance. As the difference in ground potentials increases, accurate measurement of sensitive equipment voltages is impeded. For example, measurement of semiconductor devices used to invert direct current to alternating current may be impeded by ground loops.

A simplified IGBT schematic may be visualized as a MOSFET controlling the base of a BJT. The four voltage measurements may be dispersed across the IGBT to measure gate to power emitter voltage, collector current, sense emitter to power emitter voltage, and IGBT collector to power emitter voltage. A common reference or ground may be located at the power emitter terminal. Although great in theory, practical implementation of a common reference may be difficult to procure. Additionally, the high current across the resistive elements may cause substantial noise in relation to the small voltages measured. Therefore, a measurement apparatus may reduce measurement inaccuracies and allow proper measurement of the IGBT.

Indirect measurement of circuit current may be obtained with a voltage drop reading and Ohms law. The voltage drop may be measured across a resistor. The resistor may have an precise, predefined, and insignificant resistance. The resistance may be minimized such that negligible current losses or disruptions occur. The voltage drop across the resistor may be measured to determine the current flow through the circuit using Ohms law. Indirect measurement of circuit current introduces measurement errors due to the minimal size of the resistor and self-inductances or noise associated with the resistor. A current shunt may have a substantially planar structure to improve the bandwidth of the shunt. The planar shunt may have a mutual-inductance (current from power terminal and voltage from signal terminal) between 0.1-5.0 nH, and the planar shunt may have a self-inductance (power terminal loop) of 0.5-10.0 nH, which is similar to other nonplanar shunts. The planar shunt may have a bandwidth of 50-200 MHz, which is wider than nonplanar shunts that typically have a bandwidth of about 7.2 MHz.

Figure 4A:
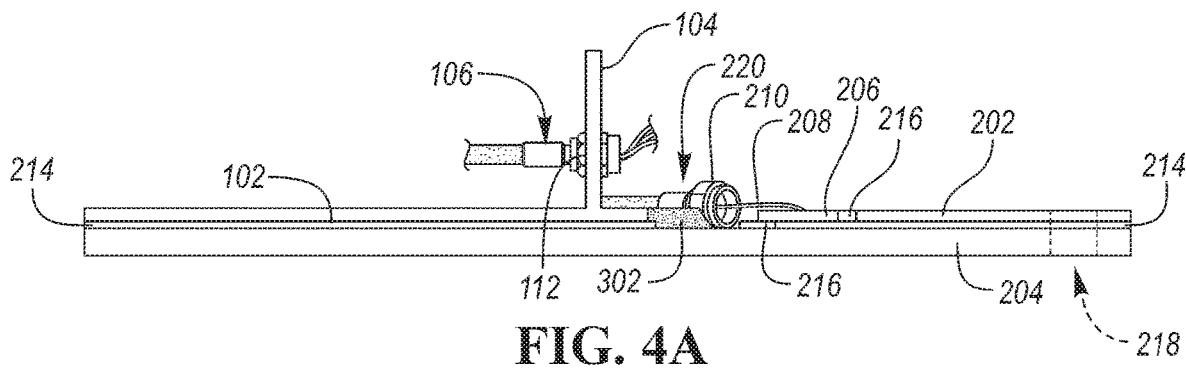
FIG. 4A is a side view of a testing apparatus.
Figure 4B:
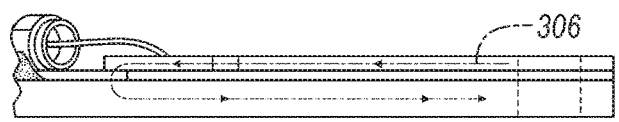
FIG. 4B is a side view of a testing apparatus having current flow paths through a shunt.
Figure 5:
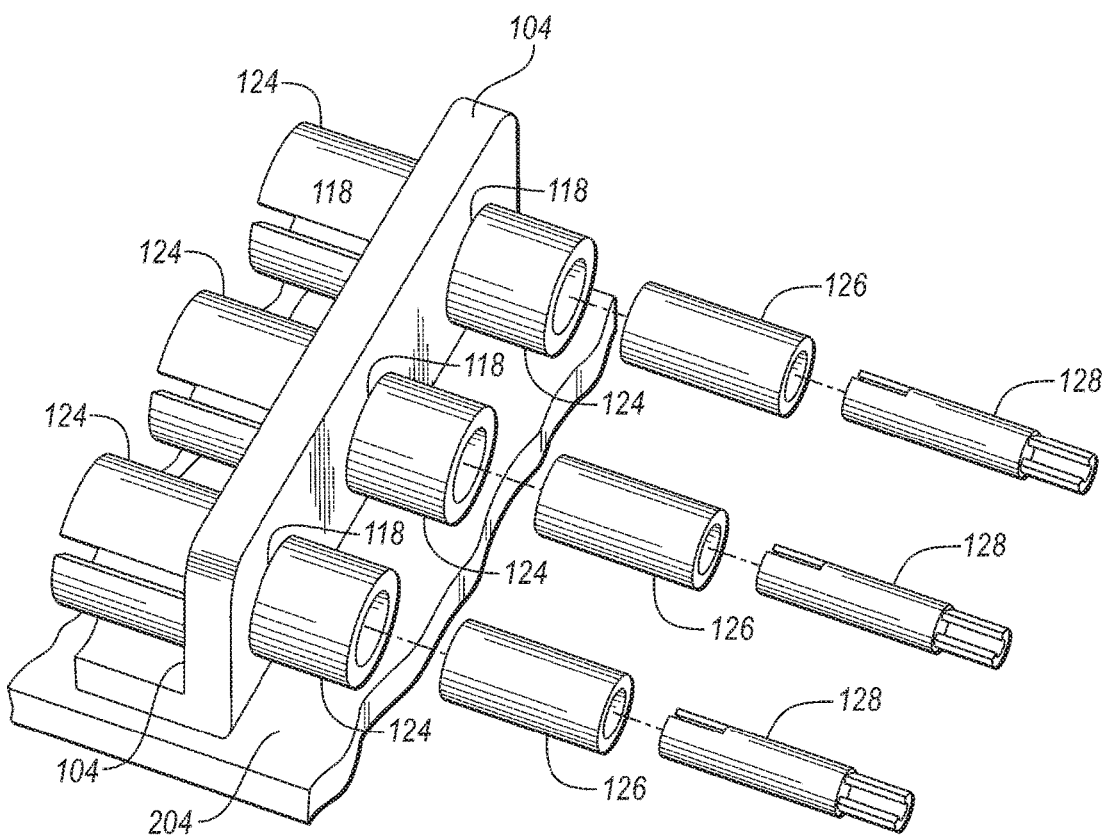
FIG. 5 is an exploded view of a test jack associated with the holster.

Referring to FIG. 1, an equivalent schematic 10 of test points 38, 40, 42, 44 for an IGBT module 14 is shown. A testing apparatus, as shown in FIGS. 2-4, may be used to measure the test points 38, 40, 42, 44 to determine IGBT performance. The rails of the IGBT module 14 are supplied by a direct current (DC) voltage source 12. Reverse-biased diode 16 indicates prevention of unwanted current flow under certain conditions. The equivalent circuit 10 includes an inductor 18 intended to create a constant current source. The IGBT module 14 includes undesirable, intrinsic inductance indicated by inductors 20, 22. The IGBT module 14 has a gate 40 connected to a gate driver, a collector 38, and a power emitter 36. The IGBT module 14 also has sense emitter located at test point 44. An "E-e" voltage 32 between the test point 44 and reference point 36 may be measured. A "C-E" voltage 34 between the test point 38 and reference point 36 may be measured. A "G-E" voltage 30 between the test point 40 and reference point 36 may be measured. An IGBT current 28 "$I_c$" may be measured by measuring a voltage drop between reference point 36 and test point 42, which is the voltage across shunt resistor 200. It should be appreciated that although an IGBT test schematic is shown, any semiconductor device or sensitive apparatus may benefit from the testing apparatus described herein.

Referring to FIGS. 2-5, a voltage probe holster 100 is shown. The voltage probe holster 100 includes a base or ground plate 102. The plate 102 may be attached to a power module through termination hole 218. The plate may be attached or connected to a support member 104. The support member 104 may be L-shaped. The member 104 and the plate 102 may be a unitary piece. The plate 102 and member 104 may be connected through brazing or another fastening method. Brazing reduces contact resistance between the plate 102 and the member 104. With regard to sensitive measurements, reduced resistances in the ground loop reduce the noise of the measurement. The conductive portions of the member 104 and plate 102 may be copper or another conductor. The member 104 and the plate 102 may be gold-plated to further reduce contact resistances. The member 102 and plate 104 may have a thickness greater than a predetermined value to ensure the thickness does not impose additional resistance. Conductor refers to any conductive material typically used to conduct electricity. For example, copper, which has a resistivity of $1.68 \times 10^{-8}$ is commonly used as a conductor. Any material having a resistivity less than $1.00 \times 10^{-6}$ may be considered a conductor for the purposes of this application.

As shown, the member 104 supports a plurality of single-ended voltage probes 106. The probes 106 include a coaxial pair of conductors 108, 110. The conductors may be considered first and second potential leads or test and reference leads. The outer housing of the probe is typically the ground lead 108, which protects the probe lead 110. Test jacks 112 may be secured to the support member 104 through nuts 114. The test jacks 112 may provide an interference connection between the probe 106 and the holster 100, securing the probe 106 to the holster 100 and providing an electrical connection to the support member 104. In some embodiments, the ground lead 108 of the probe 106 may be connected directly to the support member 104.

The holster 100 has a plurality of apertures 118 sized to receive the probes 106, as shown in FIG. 1. The apertures 118 may also be sized to retain the probes 106. The probes 106 may connect directly to the apertures 118 or be connected through test jacks 112. In other embodiments, the test jacks 112 may be brazed to the support member 104. The test jacks 112 may include a reference or ground portion 124 brazed to the support member 104, which include an interference fit with the ground lead 108. The ground portion 124 may be stamped or formed from the material removed to create the apertures 118. The test jacks 112 may include an insulator 126 to separate the ground portion 124 from a test lead portion 128. Both the ground portion 124 and test lead portion 128 may have an interference fit with respective leads 108, 110. The test lead 110 may be routed as close to the ground plate 102 as possible long a route to the IGBTs. The apertures 118 define a conductive outer periphery 120. The conductive outer peripheries 120 may be connected by conductive wires 122. The conductive wires 122 may extend all the way to the power module termination 116 of the plate 102.

FIGS. 2-5 also include a shunt 200 as shown. The shunt 200 has a first potential region (FPR) 202 soldered to a plurality of resistive elements 206 with solder joints 216. Other interconnect technology can be used to connect the FPR 202, SPR 204, and resistive elements 106 (e.g., conductive epoxy, sintered metal joint, diffusion bonding). The resistive elements 206 are further connected to the second potential region (SPR) 204 through solder joints 216. Both the FPR 202 and SPR 204 have a 90° corner 222 to ensure the terminal 218 is formed to connect with a power module of an inverter. The corner 222 may have different bending degrees to fit various power modules. For example, the corner 222 may be 135°. The resistive elements 206 are nonlinearly distributed between the FPR 202 and SPR 204. Meaning, the conductive paths through the FPR 202 and SPR 204 have similar lengths, minimizing relative differences in length between current paths through the resistive elements 206. The FPR 202 and SPR 204 may be separated by an insulation sheet 214. The FPR 202, SPR 204, and insulation sheet 214 may be formed from an insulated metal substrate (IMS) board having a first conductive layer, second conductive layer, and insulation layer, respectively. The top, conductive layer 202 may be etched to expose the insulation layer 214. Solder joints 216 may connect the resistive elements 206 disposed on insulation layer 214 with the FPR 202 and SPR 204.

A first potential lead (FPL) 208, which is also considered at least one of a test lead or reference lead, may connect to the FPR 202 through a protrusion extending from the FPR 202. A second potential lead (SPL) 210, which is also considered at least one of a test lead or reference lead, may connect to the SPR 204. A signal terminal 220 may house an FPL 208 and SPL 210. The SPL 210 may be the outer housing of an SMC connector. The housing may be electrically connected to the SPR 204 such that the potential of the SPR 204 and SPL 210 are same. The FPL 208 may be electrically connected to the FPR 202 via a conductor 224 (e.g., wire).

Since all conductors intrinsically resist the flow of electrons based on the length of the conduction path, the length between the FPR 202 and SPR 204 from the terminal 218 can have an impact on the voltage drop. Meaning, dissimilar lengths of conductive material in the path may cause errors or uncertainty in the voltage drop measurement. The 90° corner may cause dissimilar lengths of the current path. The shunt 200, therefore, is designed such that the connecting edge of the FPR 202 and resistive elements 206 may be nonlinear ensuring that a plurality of current paths among the FPR 202 have similar lengths to reduce the resistive variance of the current paths. The similar lengths may also reduce inductive variance of the current paths, as well. The substantially similar current path lengths may also reduce hot spots within the conduction path.

To establish a common reference or ground loop, a bridge 302 may be used to connect the reference 210 of the current measurement voltage probe 220 to the common ground loop of the other voltage probes 106. The bridge 302 may be a wire, solder material, weld material, part of the IMS board, another implement, or combination thereof. A complete, direct connection between the reference 210 of the current measurement voltage probe 220 and the common ground loop may be disadvantageous because of high current flowing through the SPR 204. The high current flowing through the SPR 204 may disrupt the common ground loop of the support member 104, introducing noise and measurement error to the voltage measurements of voltage probes 106 and 220. Therefore, the bridge 302 may be sized to ensure a proper ground connection with the support member 104 or conductive periphery 120, yet minimize high current leakage into the common ground loop. Meaning, the cross-sectional conductive area of the bridge 302 may be the same size as the test probe 208. The bridge 302 may traverse the shortest distance between the reference 210 of the current measurement voltage probe 220 and the conductive wires 122 or support member 104. In other embodiments, the bridge 302 is in a straight line, conducting between the reference lead 210 of the current measurement voltage probe 220 and the holster 100 base plate 102. In other current measurement voltage probe 220 configurations, the bridge 302 may follow a shortest curved path between the reference lead 210 and the plate 102. A thickness of the bridge 302 may be minimized to increase the resistance of the bridge 302, thereby ensuring high currents of the shunt are stopped from flowing on the bridge because the path of least resistance is taken. The plate 102 of the holster 100 may be insulated with an insulator 214 from the SPR 204 to ensure additional noise from high currents of the SPR 204 do not impact the voltage reference loop of the holster 100. The bridge may be offset from a direct flow path of the shunt current 306. For example, shunt current 306 flows from the FPR 202 to the SPR 204 through the resistor 206. The bridge 302 as shown is in a low flow region of the shunt 202 as current generally follows the most direct path (path of least resistance). Meaning, the bridge 302 is placed in an area where the resistive elements 206 are not.

To protect voltage probes 106 used to measure voltage parameters of the IGBT 14; the testing apparatus may include a shield 304 to reduce noise induced on the test leads 110 of the voltage probes 106, which are exposed to high currents flowing through the shunt 200 when the leads are connected to the IGBT 14. The shield 304 may be offset from the FPR 202 and insulated from the SPR 204. The shield 302 may be formed by an etched portion of the first layer 202 of IMS board. The shield 302 provides a protected route or pathway to the IGBT 14. The shield 302 may be conductive to disperse magnetic or electric fields. The shield 302 may be coupled with an insulator 214. The shield 302 may run parallel to the shunt 200 to protect the test leads 110 from the high currents of the shunt 200. The test leads 110 of the voltage probes 106 may be twisted and routed along the shield 302 to the IGBT 14. The test leads 110 may be secured to the shield 302 using fasteners or epoxy. The shield 302 may be tubular or have tubular sections to further shield the leads 110. The leads 110 may be sheathed by individual insulators as well.

The words used in the specification are words of description rather than limitation, and it is understood that various changes may be made without departing from the spirit and scope of the disclosure. As previously described, the features of various embodiments may be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. A testing apparatus comprising:
    a holster including a jack defining a conductive periphery connected with conductive wires configured to connect with a reference lead of a voltage probe to form a common ground;
    a shunt defining first and second regions of different potential having predetermined difference, the second region configured to connect with a reference lead of a shunt probe; and
    a bridge configured to connect the reference lead of the shunt probe with the conductive wires of the common ground.

2. The apparatus of claim 1, wherein the bridge traverses a shortest distance between the second region and the holster.

3. The apparatus of claim 1, wherein the shunt includes a resistive element that connects the first and second regions.

4. The apparatus of claim 3, wherein the shunt probe includes a test lead that is connected to the first region.

5. The apparatus of claim 3, wherein a portion of the shunt is etched from an insulated metal substrate board.

6. The apparatus of claim 5, wherein the resistive element is disposed on an insulator of the insulated metal substrate board.

7. The apparatus of claim 6 further comprising, a coaxial jack configured to connect a first test lead to the first potential region and a second potential lead to the second potential region.

8. The apparatus of claim 7, wherein a housing of the jack connects the second potential lead to the second potential region.

9. The apparatus of claim 1, wherein the holster and shunt are etched from a same isolated metal substrate board.

10. The apparatus of claim 9, wherein a portion of the holster and the first potential region are etched from a same conductor of the isolated metal substrate board.

11. A testing apparatus comprising:
 a shunt defining first and second regions of different potential having predetermined difference, the second region configured to connect with a shunt probe lead; and
 a holster including a jack having a conductive periphery sized to interconnect with a ground lead of a voltage probe forming a common ground with the holster, and a shield disposed partially between at least one of the first or second regions and an active lead of the voltage probe.

12. The apparatus of claim 11 further comprising an insulation layer between the shield and the at least one of the first or second potential regions.

13. The apparatus of claim 11, wherein the holster is unitary.

14. The apparatus of claim 11, wherein the holster further comprises a stanchion for supporting the jack.

15. A testing apparatus comprising:
 a holster including a jack defining a conductive periphery connected with conductive wires configured to connect with a reference lead of a voltage probe to form a common ground;
 a shunt defining first and second regions of different potential having predetermined difference, the second region configured to connect with a shunt probe lead; and
 a bridge, traversing a shortest distance between the shunt probe lead and the conductive wires of the common ground, configured to connect the shunt probe lead with the common ground such that the common ground includes the second region and the holster.

16. The testing apparatus of claim 15, wherein the bridge is offset from a direct flow path of the shunt current.

17. The testing apparatus of claim 16, wherein the holster includes a shield disposed between a test lead of the voltage probe and the first region to reduce induced currents from the test lead.

18. The testing apparatus of claim 17, wherein a portion of the holster, shunt, bridge, and shield are formed from a same insulated metal substrate board.

19. The testing apparatus of claim 18, wherein the holster includes a support member that defines the conductive periphery.

20. The testing apparatus of claim 18, wherein the first and second regions are connected by a resistive element having a predetermined resistance.

* * * * *